(12) United States Patent
Gude

(10) Patent No.: US 11,356,099 B2
(45) Date of Patent: Jun. 7, 2022

(54) ARRANGEMENT OF SWITCHBOXES

(71) Applicant: Michael Gude, Kerpen (DE)

(72) Inventor: Michael Gude, Kerpen (DE)

( * ) Notice: Subject to any disclaimer, the term of this patent is extended or adjusted under 35 U.S.C. 154(b) by 48 days.

(21) Appl. No.: 16/873,976

(22) Filed: Sep. 2, 2020

(65) Prior Publication Data

US 2021/0075424 A1 Mar. 11, 2021

(30) Foreign Application Priority Data

Sep. 5, 2019 (DE) .......................... 102019006292.2

(51) Int. Cl.
*H03K 19/17724* (2020.01)
(52) U.S. Cl.
CPC .............................. *H03K 19/17724* (2013.01)
(58) Field of Classification Search
None
See application file for complete search history.

(56) References Cited

U.S. PATENT DOCUMENTS

| | | | | |
|---|---|---|---|---|
| 5,537,057 A * | 7/1996 | Leong | ............. | H03K 19/17704 326/39 |
| 2008/0129336 A1 * | 6/2008 | Schmit | ............. | H03K 19/17736 326/41 |
| 2010/0225354 A1 * | 9/2010 | Fukuda | ............. | H03K 19/17736 326/101 |

\* cited by examiner

*Primary Examiner* — Jany Richardson

(57) ABSTRACT

Switchboxes are especially used in integrated circuits with programmable logic (e.g. FPGAs). They are used to establish configurable signal paths between logic blocks. It is especially important to use an efficient structure, i.e. a structure whose chip area is as small as possible and which is able to realize short and fast signal paths. The task of the present invention is to significantly reduce the effort for the interconnection structures while still maintaining good routeability. This is achieved by the fact that there is no longer a switchbox (SB) on each coordinate position. It is particularly advantageous to arrange the SBs in a chessboard-like manner and also to use two SBs of different sizes which are arranged in a superordinate chessboard structure.

3 Claims, 3 Drawing Sheets

ARRANGEMENT OF SWITCHBOXES

TECHNICAL FIELD

The present application relates to connection architecture in programmable logic devices (e.g. FPGAs).

BACKGROUND OF THE INVENTION

Switchboxes are especially used in integrated circuits with programmable logic (e.g. FPGAs). They are used to establish configurable signal paths between logic blocks. It is especially important to use an efficient structure, i.e. a structure whose chip area is as small as possible and which is able to achieve short and fast signal paths.

According to the state of the art (FIG. 1) the typical architecture of an FPGA is a so-called "Island-Style" topology. Here there are three different circuit parts:
1. configurable logic blocks (CLB)
2. connectbox (CB)
3. switchbox (SB)

It is characteristic that there is also a switchbox for each CLB. CBs usually have two switchboxes.

This leads to structures where the effort for the connection elements of the circuit exceeds the effort for the actual logic.

The task of the present invention is to reduce the effort for the connection structures significantly and still maintain a good routeability.

DETAILED DESCRIPTION

The task of the present invention is to reduce the effort for the connection structures significantly and still maintain a good routeability.

This task is solved by the characteristic features of the patent claims.

Claim 1 suggests that in each coordinate direction there are grid coordinates where no Switchbox (SB) is assigned to a Configurable Logic Block (CLB) and thus grid coordinates remain free of switchboxes.

Therefore the number of grid coordinates with SBs is much smaller than the number of CLBs. Usually only 30-70% SBs are used compared to CLBs (claim 2).

According to claim 3, it is particularly advantageous if the number of grid coordinates with SBs is half the number of CLBs.

As described below, according to claim 4, it is particularly advantageous for the routing and accessibility of CLBs if they are arranged in a chessboard-like manner. This results in an alternating position with a SB and an empty position in each coordinate direction.

According to claim 5, SBs are connected parallel to the coordinate axes and each connected to at least one diagonally arranged switchbox.

Figure 1:
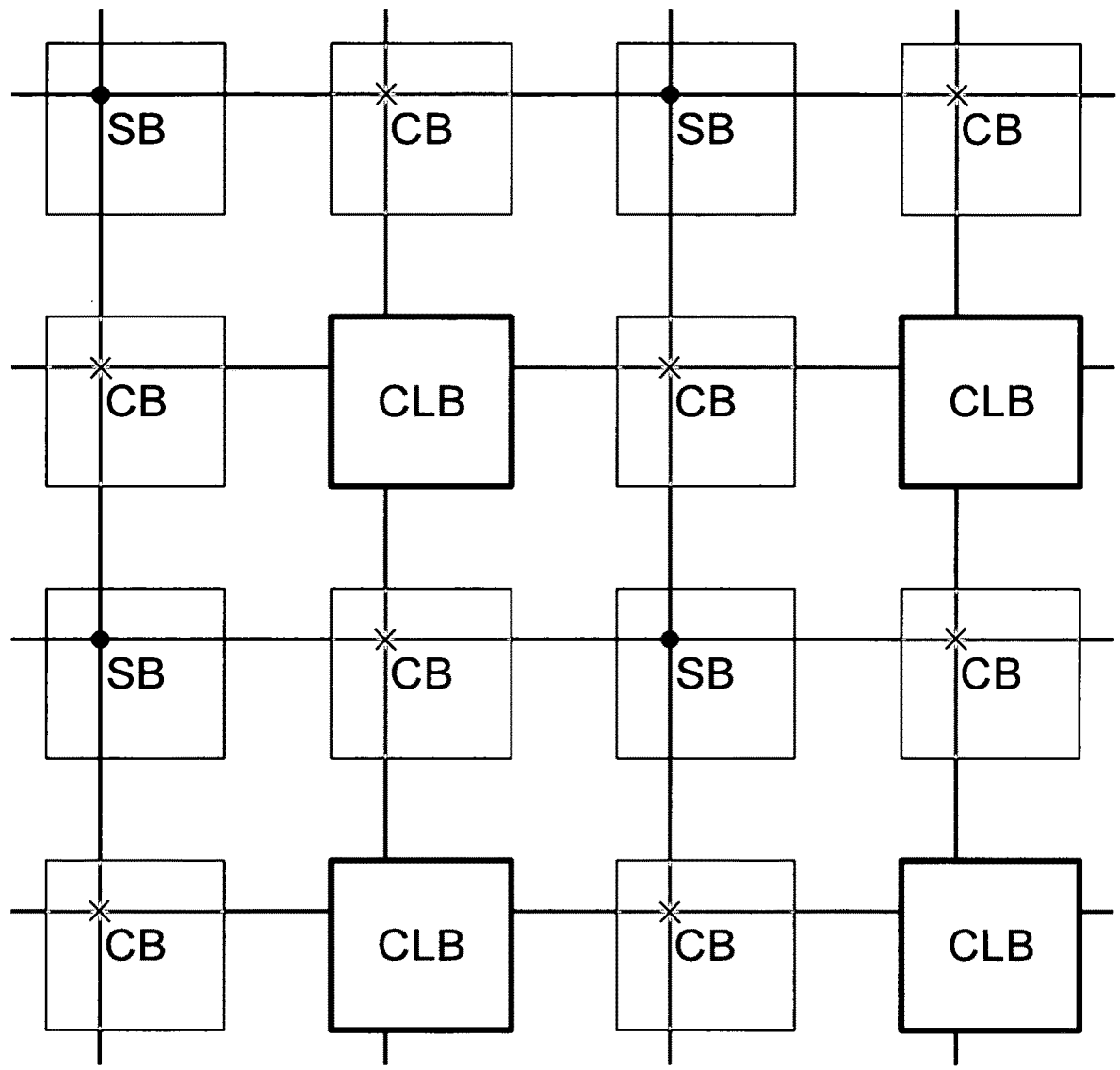
FIG. 1: Island-Style FPGA (State of the Art)
The drawing shows a state-of-the-art arrangement of CLBs, CBs and SBs. Two CBs and one SB are assigned to each CLB. For simplification signal bundles are shown as one line only.
Figure 2:
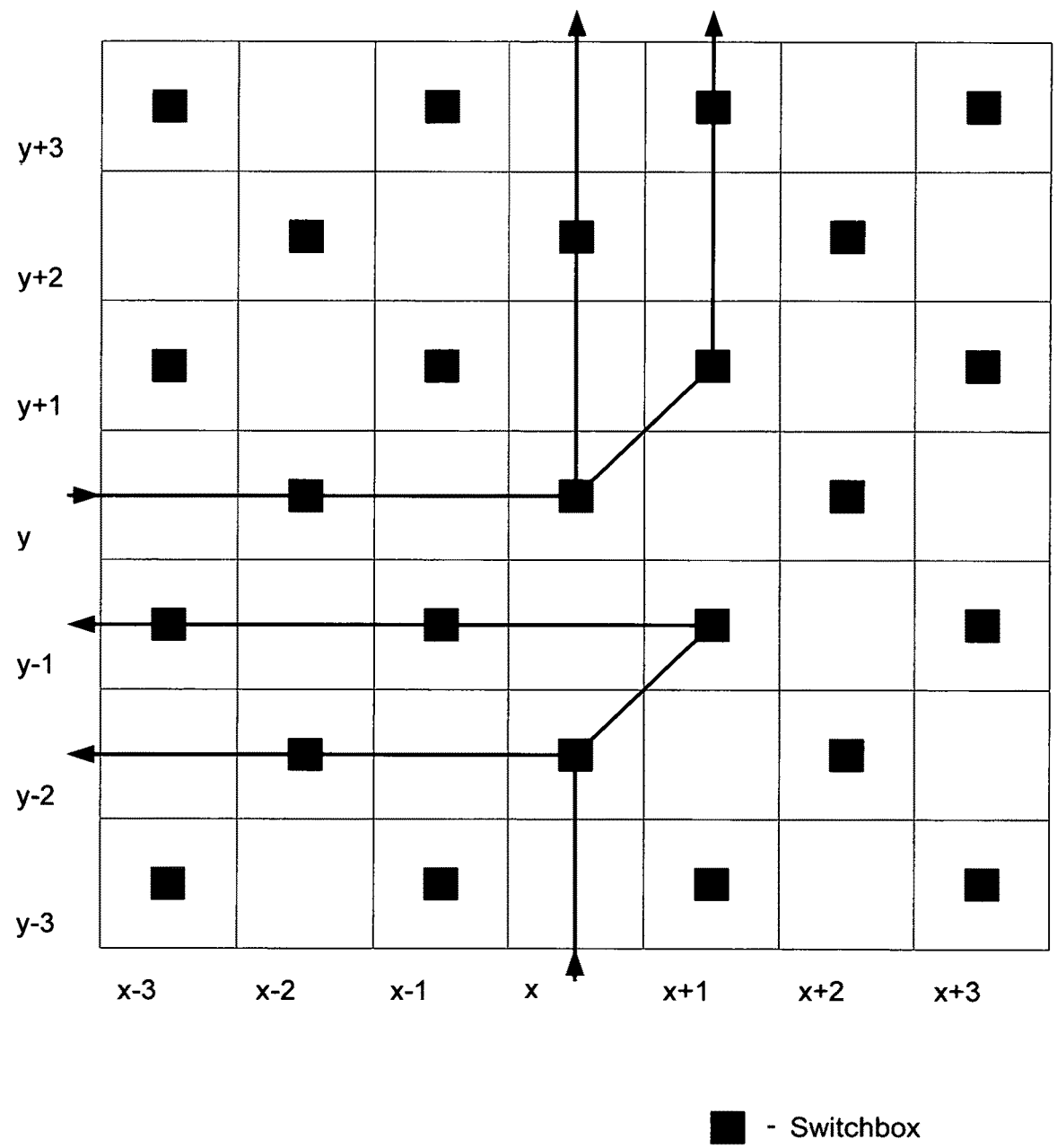
FIG. 2: X/Y Connections with Change of Direction
The drawing shows a chessboard-like arrangement of switchboxes. It also shows connections with direction changes between X and Y direction. It is obvious that from any coordinate to any coordinate in any direction a connection is possible, although not every direction change point has a switchbox.

Although the SBs are not present at each coordinate intersection, a change of direction from any coordinate to any other coordinate in any direction is possible. At intersections without SBs two SBs are connected diagonally. This is shown as an example in FIG. 2.

The switching effort can be further reduced according to claim 6 if at least two different types or sizes of switchboxes are used.

Figure 3:
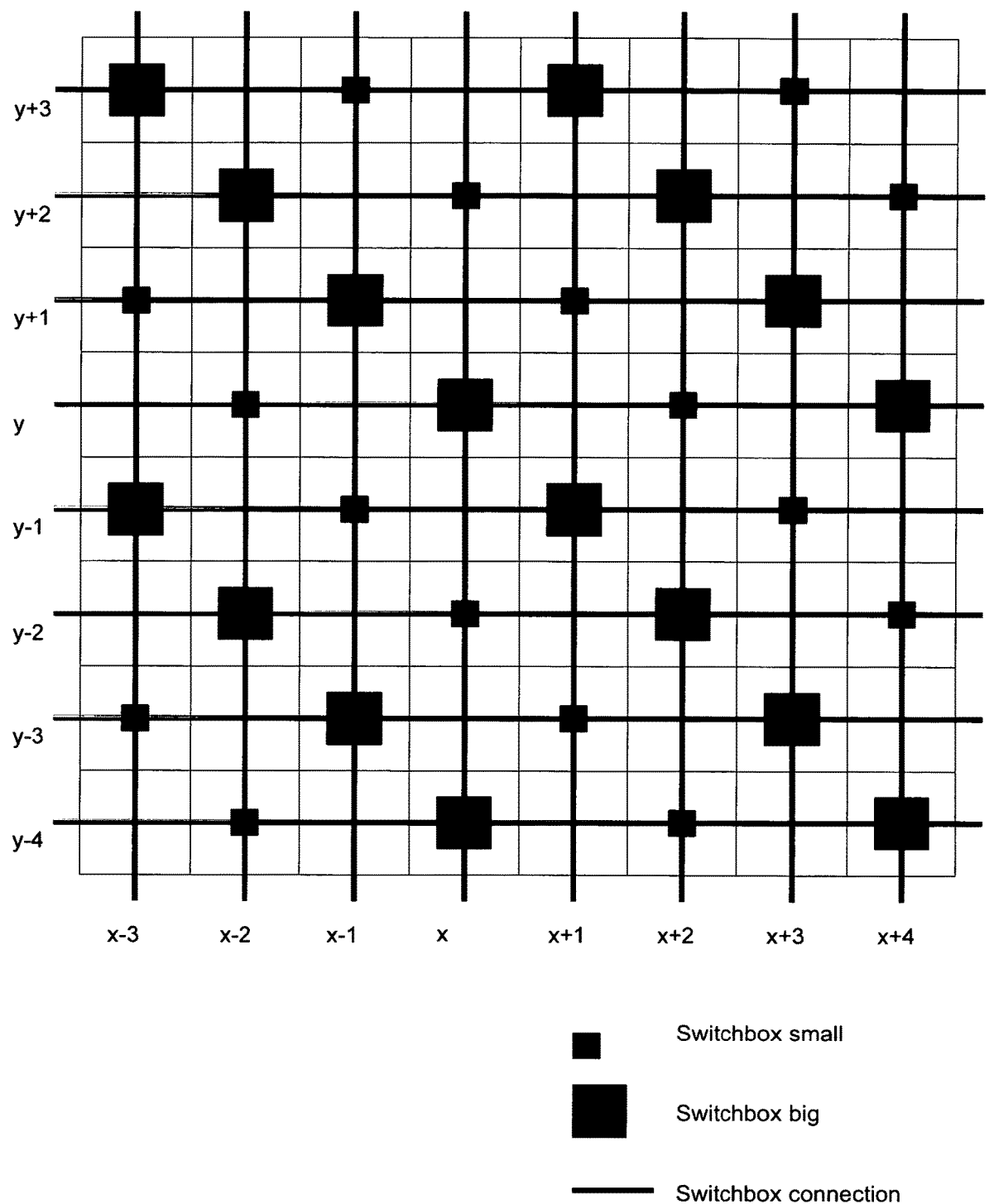
FIG. 3: Double Chessboard Structure of Switchboxes
The drawing shows chessboard-like arranged switchboxes, but they have different sizes. Small and large switchboxes are alternately present and thus form another chessboard structure.

According to claim 7, it is advantageous to use alternately a large and a small switchbox in a kind of superordinate chessboard structure, as shown in FIG. 3.

Claim 8 shows an arrangement in which the outputs of CLBs feed into SBs so that the output signals are available in any coordinate direction.

It is important to note that the drawings reveal the invention only as an example. The invention is not limited to these examples of use.

What is claimed is:
1. Arrangement of switchboxes characterized in that
in a grid-like arrangement there are grid coordinates in each coordinate direction for which no Switchbox (SB) is assigned to a Configurable Logic Block (CLB) and thus grid coordinates remain free from switchboxes
and that the number of grid coordinates with switchboxes is much smaller than the number of CLBs
and that the arrangement is like a chessboard
and that the number of grid coordinates with switchboxes is half the number of CLBs
and that the switchboxes are connected parallel to the coordinate axes and that there is at least one connection each to a diagonally arranged switch box.
2. Arrangement of switchboxes according to claim 1 characterized in that
the outputs of CLBs feed into SBs, so that the output signals are available in any coordinate direction.
3. Arrangement of switchboxes characterized in that
in a grid-like arrangement there are grid coordinates in each coordinate direction for which no Switchbox (SB) is assigned to a Configurable Logic Block (CLB) and thus grid coordinates remain free from switchboxes
and that the number of grid coordinates with switchboxes is much smaller than the number of CLBs
and that the arrangement is like a chessboard
and that the number of grid coordinates with switchboxes is half the number of CLBs
and that at least two different types or sizes of switchboxes are used
and that in a kind of superordinate chessboard structure alternately a large and a small switchbox is used.

* * * * *